United States Patent

Rheem et al.

[11] Patent Number: 5,856,676
[45] Date of Patent: Jan. 5, 1999

[54] WATER-REMOVING EXHAUST SYSTEM FOR AN ION IMPLANTER AND A METHOD FOR USING THE SAME

[75] Inventors: Byeong Ki Rheem; Sang Guen Oh, both of Kyunggi-do, Rep. of Korea

[73] Assignee: Samsung Electronic Co., Ltd., Kyungki-do, Rep. of Korea

[21] Appl. No.: 964,140

[22] Filed: Nov. 6, 1997

[30] Foreign Application Priority Data

Dec. 21, 1996 [KR] Rep. of Korea ............... 1996 69848
May 2, 1997 [KR] Rep. of Korea ............... 1997 16949

[51] Int. Cl.$^6$ ........................................ H01J 37/17

[52] U.S. Cl. ........................... 250/492.21; 250/441.11

[58] Field of Search .................. 250/492.21, 441.11

[56] References Cited

U.S. PATENT DOCUMENTS 5,731,592  3/1998  Oh et al. ...................... 250/492.21

*Primary Examiner*—Kiet T. Nguyen
*Attorney, Agent, or Firm*—Myers Bigel Sibley & Sajovec

[57] ABSTRACT

An exhaust system of an ion implanter that eliminates moisture in the process stream comprises: an exhaust pump positioned within the ion implanter; a main exhaust duct positioned outside the ion implanter; an exhaust line extending between the exhaust pump and the main exhaust duct; a gas introduction unit for introducing a moisture eliminating gas into the exhaust line; and a scrubber for removing a predetermined gas from the process stream. By introducing the moisture-eliminating gas (which is preferably heated nitrogen) into the process stream, moisture contained therein is removed from the stream, and the events described hereinabove that produce a corona discharge within the exhaust line are prevented.

12 Claims, 4 Drawing Sheets

WATER-REMOVING EXHAUST SYSTEM FOR AN ION IMPLANTER AND A METHOD FOR USING THE SAME

FIELD OF THE INVENTION

The present invention relates generally to an ion implanter used for fabricating semiconductor devices, and more particularly to an exhaust system for an ion implanter.

BACKGROUND OF THE INVENTION

Ion implantation is a process used in the manufacture of semiconductor devices. Typically, ionized dopants, such as $A_5H_3$ (arsine) and $PH_3$ (phosphine), are implanted into the surface of a masked wafer by accelerating them at high speed. Once the dopant is implanted, it can be diffused to desired regions of the semiconductor device. A typical ion implanter includes an ion source for producing ionized dopant, a dopant energizer, a mounting system for mounting the wafer, and an exhaust system for exhausting gases remaining in the cavity of the ion implanter after the completion of the ion implantation process.

A typical exhaust system includes an exhaust pump that is in communication with the cavity of the ion implanter. An exhaust line is connected at one end to the exhaust pump and at its other end to a main exhaust duct located outside of the ion implanter. The exhaust line is generally formed of polyvinyl chloride (PVC), a material that can withstand the high voltages applied to the ion implanter during processing because of its high dielectric strength.

One problem that plagues ion implanters that employ PVC as the material of the exhaust line is the adherence of contaminating by-products created during processing to the inner surface of the exhaust line. Typically, the exhaust pump is formed of steel, so some iron from the surface of the pump diffuses into the exhaust stream. Also, moisture (in the form of steam) is typically present in the exhaust. The water can oxidize the iron to cause iron oxide (rust) to form on the walls of the PVC. Once iron builds up on the inner surface of the exhaust line, moisture within the exhaust tends to condense onto the iron. Also, hot by-products from the implantation process, which typically include arsine, phosphine, or both, can be oxidized by excess moisture as demonstrated in the following reactions:

$$2AsH_3 + 5H_2O = As_2O_5 + 8H_2 \quad (1)$$

$$2PH_3 + 5H_2O = P_2O_5 + 8H_2 \quad (1)$$

Attachment of these compounds to the inner wall of the exhaust line can reduce the dielectric strength of the exhaust line significantly.

The reduction of the dielectric strength of the exhaust line and the presence of iron thereon can make the exhaust line susceptible to a the generation of a corona discharge inside the exhaust line when a high voltage is applied to the implanter. Such a corona discharge can be deleterious to the fabrication of semiconductor devices within the implanter. Moreover, because the reactions set forth above produce hydrogen gas as a reaction product, a corona discharge can ignite the hydrogen and burn the PVC of the exhaust line.

SUMMARY OF THE INVENTION

In view of the foregoing, it is an object of the present invention to solve the above described problems.

It is another object of the present invention to provide an exhaust system for an ion implanter which prevents a corona discharge from being generated inside the exhaust line.

These and other objects are satisfied by the present invention, which is directed to an exhaust system of an ion implanter that eliminates moisture in the process stream. The exhaust system comprises: an exhaust pump positioned within the ion implanter; a main exhaust duct positioned outside the ion implanter; an exhaust line extending between the exhaust pump and the main exhaust duct; a gas introduction unit for introducing a moisture eliminating gas into the exhaust line; and a scrubber for removing a predetermined gas from the process stream. By introducing the moisture-eliminating gas (which is preferably heated nitrogen) into the process stream, moisture contained therein is removed from the stream, and the events described hereinabove that produce a corona discharge within the exhaust line are prevented.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DESCRIPTION OF THE PREFERRED EMBODIMENT

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
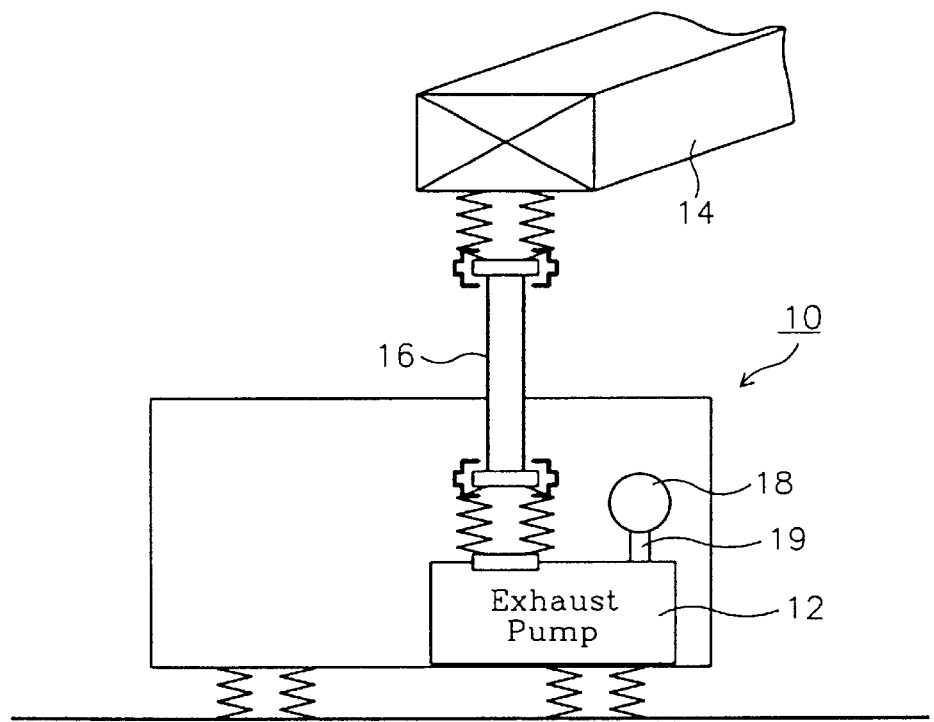
FIG. 1 is a schematic illustration of a conventional prior art exhaust system of an ion implanter.

Referring now to the Figures, FIG. 1 illustrates a conventional prior art ion implanter 10 having an exhaust system 11. The exhaust system 11 includes an exhaust pump 12 and a main exhaust duct 14. The exhaust pump 12 and the main exhaust duct 14 are fluidly interconnected by a PVC exhaust line 16. The exhaust pump 12 is also connected with an ion source 18, which is interconnected with the exhaust pump 12 via a control valve 19.

In operation, dopant is added to a semiconductor device in the ion source 18. Exhaust generated by this process travels to the exhaust pump through the control valve 19. Exhaust then travels through the exhaust line 16 and out of the ion implanter 10 via the main exhaust duct 14.

Figure 2:
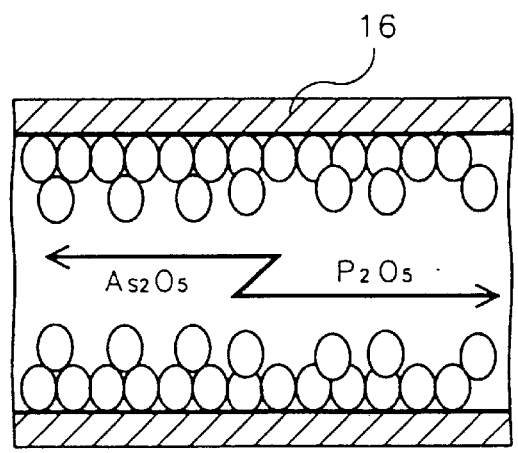
FIG. 2 cross-sectional view illustrating the exhaust line of the exhaust system shown in FIG. 1.

As shown in FIG. 2, iron from the exhaust pump 12 can deposit on the inner surfaces of the exhaust line 16. Deposited iron, which is typically cool during operation of the ion implanter 10, can condense water travelling in the form of steam from the exiting exhaust. This water tends to be retained on the deposited iron. Once this occurs, arsine and/or phosphine present in the exhaust can be oxidized by the water to produce $As_2O_5$ and $P_2O_5$. Not only can these gasses be toxic, but the hydrogen given off as a reaction product can increase the tendency of the system to generate and propogate a corona discharge under high voltage.

Figure 3:
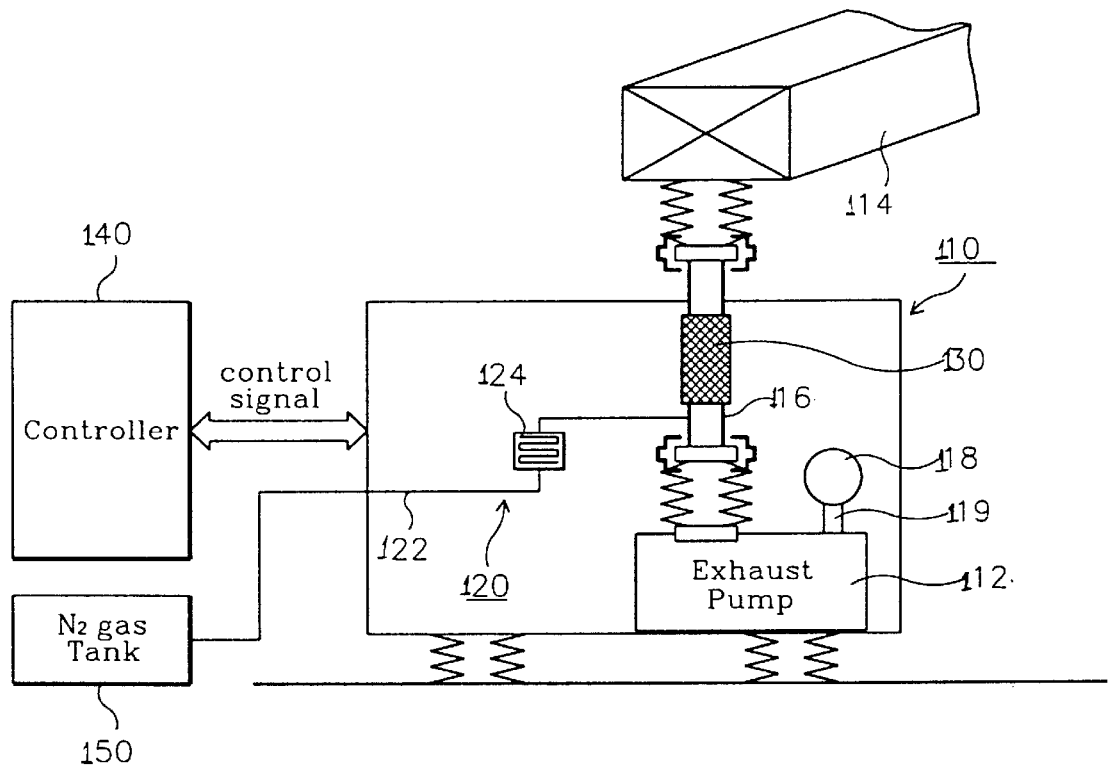
FIG. 3 is a schematic illustration of an exhaust system of an ion implanter of the present invention.

Referring now to FIG. 3, an exhaust system 111 for an ion implanter 110 of the present invention is illustrated therein. The ion implanter 110 includes an ion source 118 and a control valve 119 that operate in the manner described hereinabove for the ion implanter 10 of FIG. 1. The exhaust system 111 includes a main exhaust duct 114 located outside the ion implanter 110 and an exhaust pump 112 positioned inside the ion implanter 110. The exhaust pump 112 and the exhaust duct 114 are connected by an exhaust line 116.

Referring again to FIG. 3, the exhaust system 111 also includes a scrubber 130 positioned on the exhaust line 116 between the exhaust pump 112 and the exhaust duct 114. The scrubber 130 is included to eliminate a specific gas (such as arsine or phosphine) and moisture contained in the exhaust stream. Typically, metal oxides are employed in the scrubber 130 to remove the desired gasses, but those skilled in this art will recognize that other gas-removing materials can also be used. The scrubber 130 can also be configured to eliminate noise generated when the gases are exhausted through the exhaust line 116.

The ion implanter 110 also includes a gas introduction unit 120 (FIG. 3). The gas introduction unit 120 includes a gas storage tank 150 for storing nitrogen or another water-eliminating gas, a gas supply line 122 disposed between the tank 150 and the exhaust line 116, and a heater 124 which heats nitrogen supplied to the exhaust line 116. Those skilled in this art will recognize that, although nitrogen is preferred, any gas that can, when heated, cause water in the exhaust line 116 to evaporate or otherwise be eliminated can be used with the present invention.

Referring still to FIG. 3, operation of the exhaust pump 112 is controlled by a controller 140, which also controls overall functions of the ion implanter 110. More specifically, the controller 140 controls the valve 119 to permit exhaust into the exhaust pump 112, and also controls a valve (not shown) on the gas supply line 122. The controller 140 can be any control device known to those in this art to be suitable for controlling fluid flow.

Figure 4:
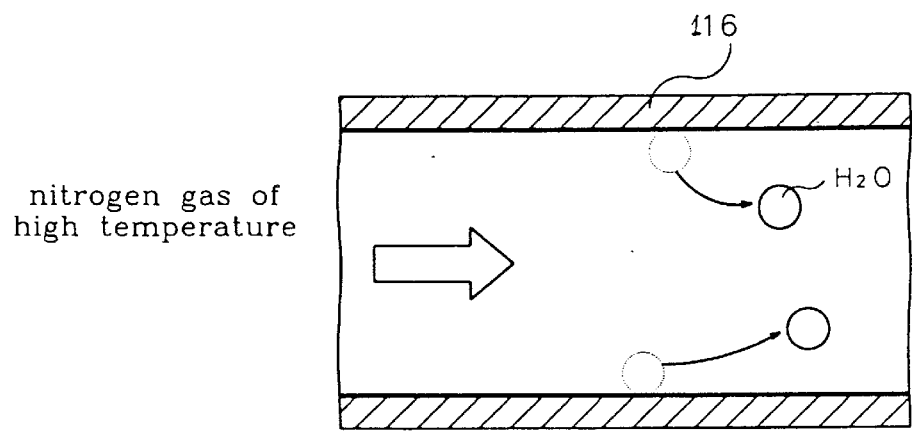
FIG. 4 is a partial cross-sectional view of the exhaust line of FIG. 3 illustrating the removal $H_2O$ by high-temperature nitrogen inside the exhaust line.

In operation of the ion implanter 110, before exhaust gasses from the process chamber of the ion implanter 110 are exhausted by the exhaust pump 122, nitrogen flowing through the gas supply line 122 (and controlled by the controller 140) is heated by the heater 124, then supplied inside the exhaust line 116. When the heated nitrogen is introduced inside the exhaust line 116, as shown in FIG. 4, any by-products present on the inner surface of the exhaust line 116 are heated by the heated nitrogen and exhausted to the main exhaust duct 114. Also, any moisture in the exhaust line 116 evaporates and exits to the exhaust duct 114. As a result, no condensation occurs inside the exhaust line 116.

In addition, because both the nitrogen and the process gas exhausted by the exhaust pump 114 are supplied through the scrubber 130 to the main exhaust duct 114, moisture and one or more specific gasses are eliminated from the process stream by the scrubber 30. Because no water is present inside the exhaust line 116, $As_2O_5$ and $P_2O_5$ components are not produced from arsine or phosphine, as the chemical reaction between $H_2O$ and these components does not occur.

Figure 5:
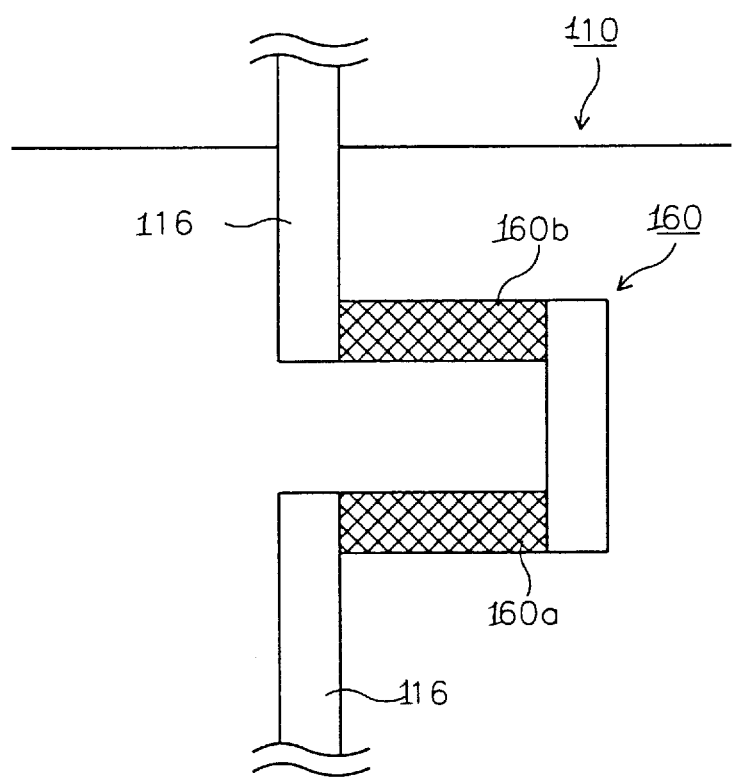
FIG. 5 is, an enlarged partial cross-sectional view of a cartridge-type scrubber that can alternatively be located at the exhaust line of the exhaust system of FIG. 3.

A single dry gas scrubber 130 is illustrated in FIG. 3; alternatively, and preferably, an exhaust system of the present invention can include multiple scrubbers for different gasses. Once such configuration is illustrated in FIG. 5, which shows a cartridge type scrubber 160. The cartridge type scrubber 160 comprises two dry gas scrubbers 160a, 160b that are disposed in parallel with each other. In the illustrated offset configuration, the exchange length for the scrubbers 160a, 160b can be increased, which improves their effectiveness. Also, any space constraint imposed by the size of the ion implanter 110 can be overcome because of the change in flow direction resulting from the cartridge configuration. In addition, the use of multiple scrubbers affords the designer the opportunity to remove different gasses from the exhaust stream by using scrubbers formed of different materials.

In the illustrated embodiments, the exhaust system 110 includes a gas introducing unit 120 as well as a scrubber (130 or 160). Those skilled in this art will recognize that ion implanters of the present invention can also eliminate moisture in the scrubber 130 without the gas introduction system 120.

Figure 6:
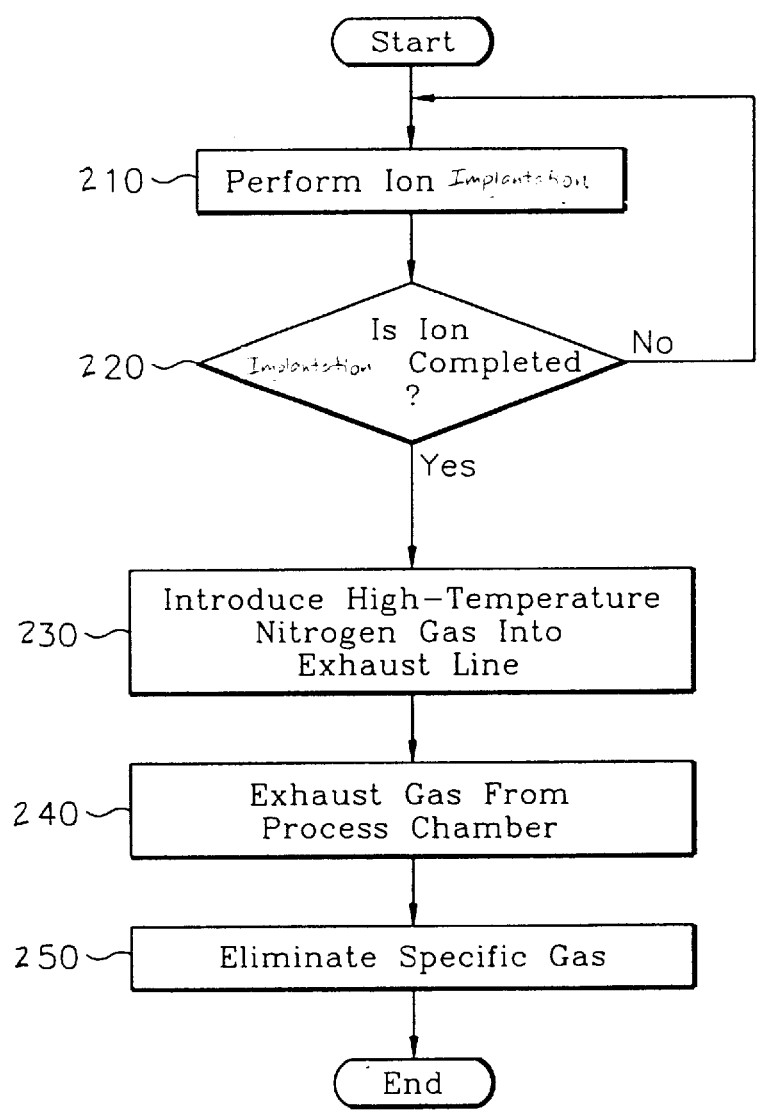
FIG. 6 is a flow chart illustrating the process for controlling the exhaust system of FIG. 3.

FIG. 6 is a flow chart illustrating the manner in which the controller 140 controls the exhaust system 111. At step 210 of FIG. 6, ion implantation is performed in a process chamber of the ion implanter 110. The controller 140 senses in step 220 whether the ion injection is completed. If the ion implantation is not completed, the controller 140 proceeds again to step 210, which enables the ion implantation to continue. If implantation is completed, the controller 140 proceeds to step 230, in which nitrogen is introduced from the tank 150 to the gas supply line 122 and heated by the heater 124. As a result, any cool by-product in the exhaust line 116 is heated; at the same time, moisture therein is exhausted to the main exhaust duct 114.

After the introduction of the nitrogen, the controller 140 proceeds to step 240, in which the process gas in the process chamber of the ion implanter 110 is exhausted to the exhaust line 116 via the exhaust pump 112. In step 250, the specific component of the process gas exhausted is eliminated by the scrubber 130.

As described above, the ability of the exhaust system of the present invention to eliminate water from the exhaust line prevents the repeated deposition of iron-containing by-products on the inner surface of the exhaust line. Without water present, arsine and phosphine are not converted to $As_2O_5$ and $P_2O_5$, so the dielectric strength of the exhaust line does not decrease. As a result, dielectric destruction of the exhaust line does not occur. Also, hydrogen gas is not given off. Accordingly, the conditions are poor for the generation of a corona discharge inside the exhaust line, so the manufacturing process can be more consistent and the exhaust line can be prevented from being burned and destroyed.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein. In the claims, means-plus-function clauses are intended to cover the structures described herein as performing the recited function and not only structural equivalents but also equivalent structures.

What is claimed is:

1. An exhaust system of an ion implanter used for implanting impurity ions on a surface of a semiconductor wafer, comprising:

an exhaust pump positioned within the ion implanter;

a main exhaust duct positioned outside the ion implanter;

an exhaust line extending between said exhaust pump and said main exhaust duct;

a gas introduction unit for introducing a moisture eliminating gas to said exhaust line; and a scrubber for removing a predetermined gas from a process gas in said exhaust line.

2. The exhaust system according to claim 1, wherein said gas introduction unit comprises a tank for storing a moisture eliminating gas, a gas supply line disposed between said tank and said exhaust line, and a heater for applying heat to the moisture eliminating gas flowing through said gas supply line.

3. The exhaust system according to claim 2, wherein said gas supply line is connected in communication with said exhaust line between said scrubber and said exhaust pump.

4. The exhaust system according to claim 1, wherein said scrubber is a dry gas scrubber.

5. The exhaust system according to claim 1, wherein said scrubber comprises a plurality of dry gas scrubber units.

6. The exhaust system according to claim 1, wherein said scrubber includes a metallic oxide for eliminating one of the group of gasses consisting of: $BF_3$, $PH_3$, and $AsH_3$ or a mixture thereof.

7. A method using an exhaust system for exhausting process gasses from an ion implanter used for implanting impurity ions on a surface of a semiconductor wafer, the exhaust system having an exhaust pump, a main exhaust duct disposed outside the ion implanter, an exhaust line disposed between the exhaust pump and the main exhaust duct, a gas introducing line for introducing a moisture eliminating gas into the exhaust line, and a scrubber for eliminating a specific gas contained in a process gas exhausted from a process chamber to the exhaust line, said method comprising the steps of:

introducing a moisture eliminating gas into the exhaust line;

exhausting the process gas from the process chamber to the exhaust line; and eliminating the specific gas from the process gas flowing through the exhaust line; and exhausting the remainder of the process gas through the main exhaust duct.

8. The method defined in claim 7, wherein said step of introducing a moisture eliminating gas comprises introducing nitrogen into the exhaust line.

9. The method defined in claim 8, further comprising the step of heating the moisture eliminating gas prior to said introducing step.

10. The method defined in claim 7, further comprising the step of heating the moisture eliminating gas prior to said introducing step.

11. The method defined in claim 7, wherein said eliminating step comprises eliminating at least one gas of the group consisting of: $AsH_3$; $PH_3$; and $BF_3$.

12. The method defined in claim 7, further comprising the steps of:

implanting dopant into a semiconductor substrate;

sensing whether said implanting step has been completed; and initiating said introducing step after said sensing step determines that said implanting step has been completed.

* * * * *